United States Patent
Manipatruni et al.

(10) Patent No.: US 11,139,389 B2
(45) Date of Patent: *Oct. 5, 2021

(54) MAGNETIC STATE ELEMENT AND CIRCUITS

(71) Applicant: Intel Corporation, Santa Clara, CA (US)

(72) Inventors: Sasikanth Manipatruni, Hillsboro, OR (US); Dmitri E. Nikonov, Beaverton, OR (US); Ian A Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 412 days.

This patent is subject to a terminal disclaimer.

(21) Appl. No.: 15/427,968

(22) Filed: Feb. 8, 2017

(65) Prior Publication Data

US 2017/0148903 A1 May 25, 2017

Related U.S. Application Data

(63) Continuation of application No. 14/696,965, filed on Apr. 27, 2015, now Pat. No. 9,570,139, which is a (Continued)

(51) Int. Cl.
*H01L 29/66* (2006.01)
*H03K 19/16* (2006.01)
(Continued)

(52) U.S. Cl.
CPC ...... *H01L 29/66984* (2013.01); *G11C 11/161* (2013.01); *G11C 11/1653* (2013.01);
(Continued)

(58) Field of Classification Search
CPC .............. G11C 11/1697; G11C 11/161; G11C 11/1675; G11C 11/16; H03K 19/16
(Continued)

(56) References Cited

U.S. PATENT DOCUMENTS 5,734,605 A * 3/1998 Zhu ................. H01L 27/228
365/173
5,784,225 A * 7/1998 Saito .................. B82Y 10/00
29/603.14

(Continued)

FOREIGN PATENT DOCUMENTS

JP 2006526907 11/2006
JP 2007088068 4/2007

(Continued)

OTHER PUBLICATIONS

First Office Action for U.S Appl. No. 13/996,998, dated Oct. 15, 2014.

(Continued)

*Primary Examiner* — Fernando Hidalgo
(74) *Attorney, Agent, or Firm* — Schwabe, Williamson & Wyatt, P.C.

(57) ABSTRACT

Described is an apparatus, for spin state element device, which comprises: a variable resistive magnetic (VRM) device to receive a magnetic control signal to adjust resistance of the VRM device; and a magnetic logic gating (MLG) device, coupled to the VRM device, to receive a magnetic logic input and perform logic operation on the magnetic logic input and to drive an output magnetic signal based on the resistance of the VRM device. Described is a magnetic de-multiplexer which comprises: a first VRM device to receive a magnetic control signal to adjust resistance of the first VRM; a second VRM device to receive the magnetic control signal to adjust resistance of the second VRM device; and an MLG device, coupled to the first and second VRM devices, the MLG device having at least two output magnets to output magnetic signals based on the resistances of the first and second VRM devices.

28 Claims, 10 Drawing Sheets

Related U.S. Application Data continuation of application No. 13/996,998, filed as application No. PCT/US2012/031072 on Mar. 29, 2012, now Pat. No. 9,070,468.

(51) Int. Cl.

| | | |
|---|---|---|
| *G11C 11/16* | (2006.01) | |
| *H01L 27/22* | (2006.01) | |
| *H01L 43/08* | (2006.01) | |
| *H01L 43/10* | (2006.01) | |
| *H01L 43/12* | (2006.01) | |

(52) U.S. Cl.
CPC ...... *G11C 11/1659* (2013.01); *G11C 11/1673* (2013.01); *G11C 11/1675* (2013.01); *G11C 11/1697* (2013.01); *H01L 27/226* (2013.01); *H01L 43/08* (2013.01); *H01L 43/10* (2013.01); *H01L 43/12* (2013.01); *H03K 19/16* (2013.01); *G11C 11/16* (2013.01)

(58) Field of Classification Search
USPC .................. 365/173, 5, 7, 131, 158, 171
See application file for complete search history.

(56) References Cited

U.S. PATENT DOCUMENTS

| | | | |
|---|---|---|---|
| 7,933,144 B2 | 4/2011 | Bangert et al. | |
| 8,111,007 B2 | 2/2012 | Chung et al. | |
| 8,111,087 B2 | 2/2012 | Inokuchi et al. | |
| 8,243,502 B2 | 8/2012 | Sakimura | |
| 8,406,046 B2 | 3/2013 | Kobayashi | |
| 8,564,293 B2 | 10/2013 | Ando et al. | |
| 8,861,259 B2 | 10/2014 | Haukness | |
| 9,111,960 B2 | 8/2015 | Kim | |
| 2002/0036877 A1* | 3/2002 | Sakakima ............ B82Y 10/00 | |
| | | | 360/324.11 |
| 2005/0047204 A1 | 3/2005 | Johnson | |
| 2005/0201180 A1 | 9/2005 | Naguib et al. | |
| 2006/0164124 A1 | 7/2006 | Koch et al. | |
| 2007/0064342 A1 | 3/2007 | Nakamura et al. | |
| 2007/0109839 A1* | 5/2007 | Katti ................. G11C 11/16 | |
| | | | 365/158 |
| 2007/0164781 A1 | 7/2007 | Bangert et al. | |
| 2008/0239930 A1 | 10/2008 | Saito et al. | |
| 2009/0243653 A1 | 10/2009 | Inokuchi et al. | |
| 2009/0251956 A1 | 10/2009 | Hwang et al. | |
| 2010/0074092 A1* | 3/2010 | Zhu ..................... H01L 27/228 | |
| | | | 369/126 |
| 2010/0097063 A1 | 4/2010 | Ando et al. | |
| 2010/0195381 A1 | 8/2010 | Karg et al. | |
| 2010/0265760 A1 | 10/2010 | Sakimura et al. | |
| 2011/0051503 A1* | 3/2011 | Hu ........................ G11C 11/161 | |
| | | | 365/158 |
| 2011/0286264 A1* | 11/2011 | Kobayashi ............ H01L 27/228 | |
| | | | 365/171 |
| 2012/0134199 A1 | 5/2012 | Zhu et al. | |
| 2012/0161261 A1 | 6/2012 | Garner et al. | |
| 2012/0176154 A1* | 7/2012 | Behin-Aein ........... H03K 19/20 | |
| | | | 326/37 |
| 2012/0181644 A1* | 7/2012 | Ducruet .............. G11C 11/1675 | |
| | | | 257/421 |
| 2012/0250399 A1* | 10/2012 | Sugiyama .............. G11C 5/148 | |
| | | | 365/158 |
| 2012/0314489 A1* | 12/2012 | Lilja ..................... G11C 11/161 | |
| | | | 365/158 |
| 2013/0100725 A1 | 4/2013 | Kim et al. | |

FOREIGN PATENT DOCUMENTS

| | | |
|---|---|---|
| JP | 2009239751 | 8/2010 |
| WO | 2004100170 | 11/2004 |
| WO | 2008123023 | 10/2008 |
| WO | 2009078242 | 2/2009 |
| WO | 2010087271 | 8/2010 |
| WO | 2013147781 | 10/2013 |

OTHER PUBLICATIONS

International Preliminary Report on Patentability, dated Oct. 9, 2014, for PCT Patent Application No. PCT/US2012/031072.
International Search Report and Written Opinion for PCT Application No. PCT/US2012/031072, dated Nov. 23, 2013.
Non-Final Office Action dated Jun. 23, 2016 got U.S. Appl. No. 14/696,965.
Notice of Allowance for U.S. Appl. No. 13/996,998, dated Mar. 11, 2015.
Second Office Action for U.S. Appl. No. 13/996,998, dated Feb. 9, 2015.
Notice of Allowance dated Oct. 3, 2016 for U.S. Appl. No. 14/696,965.
Office Action dated Mar. 3, 2016 for U.S. Appl. No. 14/696,965.
Non-Final Office Action dated Mar. 28, 2019 for IN Patent Application No. 6573/CHENP/2014, with English translation.
Office Action [Art. 94(3) communication] dated Nov. 2, 2018 for European Patent Application No. 12873104.9.
Wang, J. et al., "Programmable Spintronics Logic Device Based on a Magnetic Tunnel Junction Element", Journal of Applied Physics 97, 10D509 (2005); https://doi.org/10.1063/1.1857655, 3 pages.

* cited by examiner

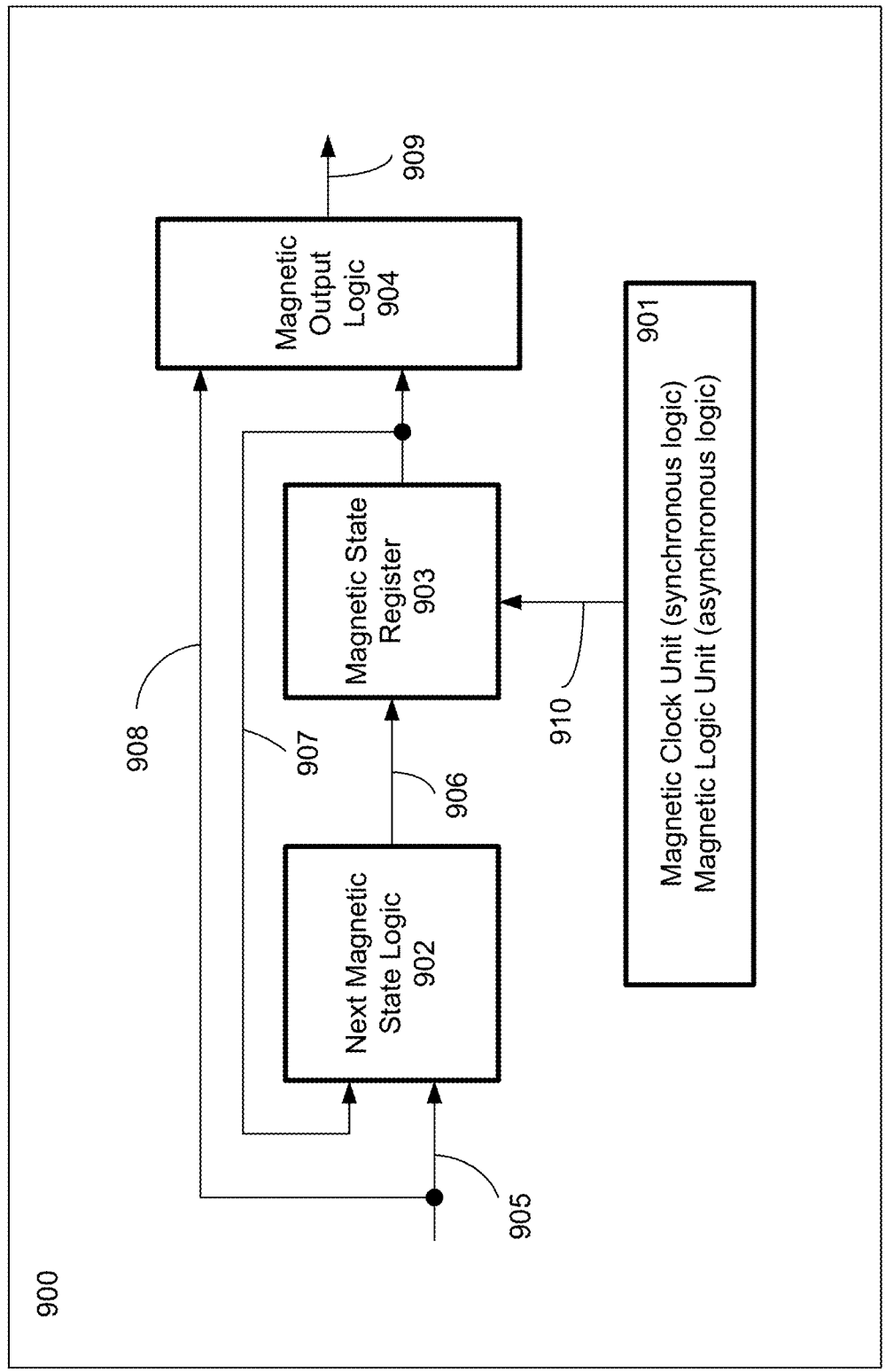

MAGNETIC STATE ELEMENT AND CIRCUITS

CLAIM OF PRIORITY

This application is a continuation of, and claims the benefit of priority of U.S. application Ser. No. 14/696,965, filed on Apr. 27, 2015, titled, "MAGNETIC STATE ELEMENT AND CIRCUITS", which will issue as U.S. Pat. No. 9,570,139 on 14 Feb. 2017, which is a continuation and claims the benefit of priority of U.S. patent application Ser. No. 13/996,998, filed 21 Jun. 2013, titled, "MAGNETIC STATE ELEMENT AND CIRCUITS", which issued as U.S. Pat. No. 9,070,468, on 30 Jun. 2015 which is a U.S. National Stage Filing under 35 U.S.C. § 371 from International Patent Application No. PCT/US2012/031072, filed 29 Mar. 2012, titled "MAGNETIC STATE ELEMENT AND CIRCUITS," which are incorporated by reference in entirety.

BACKGROUND

Low-power operation of computing systems may be achieved by using spin rather than charge as a state variable coupled with spin-to-charge and charge-to-spin conversion circuits. However, repeated spin-to-charge conversion circuits offset the advantage of low-power operation of the computing system. One example of spin based devices is a magnetic memory. However, known spin based devices cannot perform logic computations.

BRIEF DESCRIPTION OF THE DRAWINGS

Embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 9 is a general purpose spin finite state machine, according to one embodiment of the disclosure.

DETAILED DESCRIPTION

Figure 1:
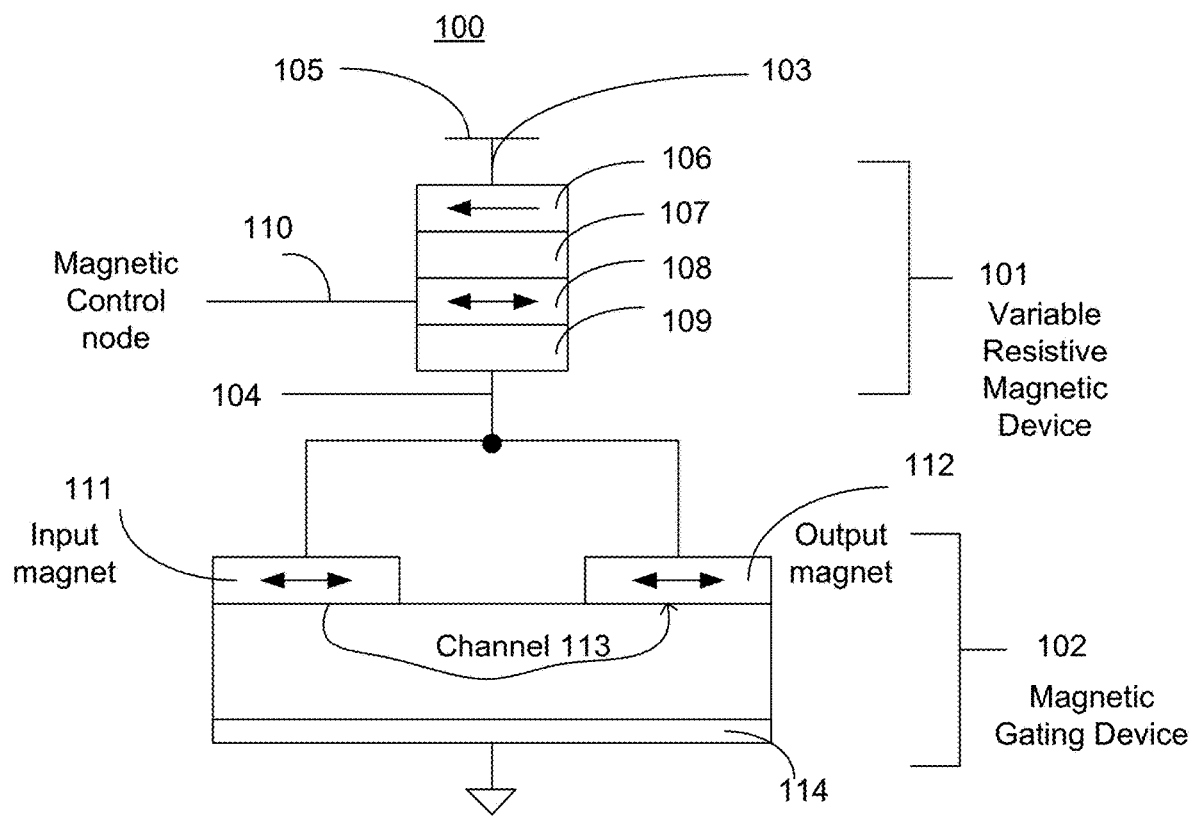
FIG. 1 is a cross-section of a spin state element, according to one embodiment of the disclosure.

Magnetic memories are an example of spin based devices that use a Magnetic Tunneling Junction (MTJ) device having a fixed or pinned layer and a free layer as described in "Current Switching in MgO-Based Magnetic Tunneling Junctions," IEEE Transactions on Magnetics, Vol. 47, No. 1, January 2011 (beginning at page 156) by Zhu, et al. The direction of magnetization in the free magnet (FM) layer is switched from one direction to another through spin transfer torque using a spin-polarized current. This direction determines whether an MTJ device is storing a logical 1 or a logical 0. When the magnetizations of the free and fixed/pinned layer (PM) of an MTJ device are aligned (parallel to one another) the magnetic resistance ($R_P$) of the MTJ device is lower than when the moments are opposite or anti-parallel ($R_{AP}$). Lower resistance can be identified as '1' and higher resistance as '0.'

An All Spin Logic Device (ASLD) with built-in memory is described in Behtash Behin-Aein et al, "Proposal for an all-spin logic device with built-in memory," Nature Nanotechnology, Vol. 5, April 2010, and Srikant Srinivasan, "Spin Logic Device With Inbuilt Nonreciprocity," IEEE Transactions on Magnetics, Vol. 47, No. 10, October 2011. However, the ASLD device is unable to provide a state element operation which has a controlled output that can be put in a disabled state to retain the logic state from inputs from an earlier clock cycle.

Described herein is a magnetic state element or a spin state element (SSE) for implementing spintronic logic e.g., finite state machines, de-multiplexers, latches, flip-flops, etc. In one embodiment, SSE comprises a variable resistive magnetic device to receive a magnetic control signal to adjust resistance of the variable resistive magnetic device; and a magnetic logic gating device, coupled to the variable resistive magnetic device, to drive an output magnetic signal based on the resistance of the variable resistive magnetic device.

In such an embodiment, the logic truth table of the SSE can be described with reference to the magnetic state of the magnetic control signal. For example, when the magnetic state of the magnetic control signal is indicative of a logical 1, the input signal at an input magnet of the magnetic logic gating device passes through a channel of the magnetic logic gating device to its output magnet. When the magnetic state of the magnetic control signal is indicative of a logical 0, the output magnet retains its logical value i.e., its magnetic state. The SSE described herein allows for zero (or substantially zero) retention power due to magnetic retention times. For example, logic state of a computer processor formed from the SSEs can be held for several years with little or no power consumption. The SSE described herein can also be used for developing a de-multiplexer and a state machine as described in some embodiments.

In one embodiment, the SSE is used for implementing a finite state machine with the ability to store a logical state of a magnetic logic unit between computations. The embodiments of the SSE discussed herein enable implementation of spin logic for low power computer systems. Other technical effects are contemplated by the embodiments discussed herein.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical or magnetic connection between the things that are connected, or an indirect connection through one or more passive or active intermediary devices.

The term "circuit" herein generally means one or more passive and/or active components that are arranged to cooperate with one another to provide a desired function.

The term "signal" herein generally means at least one spin, magnetic, electric field, current signal, voltage signal or data/clock signal. The meaning of "a", "an", and "the" include plural references. The meaning of "in" includes "in" and "on".

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. The term "substantially" herein refers to being within 10% of the target.

FIG. 1 is a cross-section of spin state element 100, according to one embodiment of the disclosure. In one embodiment, the spin state element 100 comprises a variable resistive magnetic device 101 coupled to a magnetic logic gating device 102.

In one embodiment, the variable resistive magnetic device 101 comprises a plurality of layers coupled together between at least two terminals, 103 and 104. In one embodiment, the terminal 103 (also referred herein as the first terminal) is coupled to a power supply source. In one embodiment, the terminal 104 (also referred herein as the second terminal) is coupled to the magnetic logic gating device 102. In one embodiment, the power supply source at the first terminal 103 is one of a positive power supply (e.g., 10 mV), a negative power supply (e.g., −10 mV), a direct-current (DC) power supply, a clocked power supply (e.g., a power supply toggling between 10 mV and 0, or 10 mV and −10 mV, etc with various combinations of duty cycles), an unpowered supply, etc. In one embodiment, the second terminal 104 provides a power supply (or a version of power supply) to the magnetic logic gating device 102 according to the resistivity of the variable resistance magnetic device 101.

In one embodiment, the plurality of layers includes a pinned or fixed magnet (PM) layer 106 with a pre-determined magnetization direction. In one embodiment, a ferromagnetic layer is pinned by depositing an adjacent anti-ferromagnetic layer (such as PtMn) over it and by subsequent annealing in an external magnetic field. The PM layer 106 of FIG. 1 has a magnetization direction pointing to the left. In other embodiments, the PM layer 106 may have a magnetization direction pointing to the right. In one embodiment, the PM layer 106 provides a reference resistance value associated with the variable resistive magnetic device 101. In one embodiment, the PM layer 106 is formed from CoFeB (Cobalt-iron-boron). In one embodiment, the PM layer 106 is formed from Co (Cobalt).

In one embodiment, the plurality of layers includes a free magnet (FM) layer 108 coupled to the PM layer 106. In one embodiment, the FM layer 108 is coupled to the PM layer 106 via an intermediate layer 107. In one embodiment, the intermediate layer 107 is metal layer. In one embodiment, the intermediate layer is formed from MgO (Magnesium Oxide). In one embodiment, the intermediate layer is formed from Cu (Copper).

In one embodiment, the FM layer 108 is coupled to the magnetic logic gating device 102 via a spin-scramble layer (SSL) 109 (e.g., ruthenium or thallium). In one embodiment, the SSL 109 makes the electron current from the FM layer 108 (which may be tunneling from the PM layer 106), non-spin polarized. In one embodiment, the SSL 109 has a short spin flip length. In one embodiment, the SSL 109 is used to convert a spin-dependent electro-chemical potential to a scalar voltage at the second terminal 104 of the variable resistive magnetic device 101. In one embodiment, the SSL 109 has a short-spin flip length to de-phase electron spin in the variable resistive magnetic device 101.

In one embodiment, the resistivity of the variable resistive magnetic device 101 is controlled by a magnetic control signal provided on node 110 coupled to the FM layer 108. In one embodiment, the variable resistive magnetic device 101 has a third terminal coupled to the node 110 for receiving a magnetic control signal. In one embodiment, the third terminal is coupled to the FM layer 108.

In one embodiment, the magnetic control signal is a magnetic state for coupling to the FM layer 108. In one embodiment, the magnetic control signal is at least one of an electric field and/or a spin current. In one embodiment, when the magnetic control signal (on node 110) has a magnetic state indicative of logical 1, the variable resistive magnetic device 101 allows spin polarized electrons to tunnel from the first terminal 103 to the second end 104. In such an embodiment, the resistivity of the variable resistive magnetic device 101 is lower than the reference resistivity. In one embodiment, when the magnetic control signal (on node 110) has a magnetic state indicative of logical zero state, the variable resistive magnetic device 101 substantially ceases the tunneling of spin polarized electrons from the first terminal 103 to the second end 104. In such an embodiment, the resistivity of the variable resistive magnetic device 101 is higher than the reference resistivity.

In other embodiments, depending on the magnetization direction of the PM layer 106, the role of the magnetic control signal (on node 110) reverses. For example, when the magnetization direction of the PM layer 106 is to the right, then when the magnetic control signal (on node 110) has a magnetic state indicative of logical 1, the variable resistive magnetic device 101 substantially ceases the tunneling of spin polarized electrons from the first terminal 103 to the second end 104. In such an embodiment, the resistivity of the variable resistive magnetic device 101 is higher than the reference resistivity. In such an embodiment, when the magnetic control signal (on node 110) has a magnetic state indicative of logical 0, the variable resistive magnetic device 101 allows spin polarized electrons to tunnel from the first terminal 103 to the second end 104. In such an embodiment, the resistivity of the variable resistive magnetic device 101 is lower than the reference resistivity.

The term "high resistivity" relative to the term "low resistivity" is defined as a ratio of 1:5. However, other ratios may also be used, for example, a ratio of 1:10, 1:20, etc. In one embodiment, when the variable resistive magnetic device 101 comprises a MTJ, the resistance area product is in the range of 1-100 Ohms-W. In another embodiment, when the variable resistive magnetic device 101 comprises a spin valve, the resistance area product is in the range of 1-100 milli-Ohms-$\mu^2$. In other embodiments, other materials with different resistance product ranges may be used that have low and high resistances which are distinguishable from one another.

While the embodiments herein describe a plurality of layers of the variable resistive magnetic device 101 to be four, other embodiments may use fewer than four or more than four layers of various materials to form the variable resistive magnetic device 101.

In one embodiment, the magnetic logic gating device 102 comprises an input magnet 111 coupled to an output magnet 112 via a channel/interconnect 113. In one embodiment, magnetic logic gating device 102 further comprises a contact layer 114 coupled to ground. In one embodiment, the contact layer 114 is coupled to the channel 113. In one embodiment, the input magnet 111 and the output magnet 112 are coupled to the second terminal 104 of the variable resistive magnetic device 101. In one embodiment, the input magnet 111 and the output magnet 112 are free magnets like the FM layer 108.

So as not to obscure the embodiments of the magnetic logic gating device 102, other layers are not shown. For example, the input magnet 111 and output magnet 112 may have a corresponding contact layer coupled to them for contacting with the second terminal 104. In one embodiment, vertical isolation trenches are formed between the contact layer 114 and the input magnet 111 and between the contact layer 114 and the output magnet 112. In one embodiment, a tunneling layer is formed to couple the input magnet 111 with the channel 113. In one embodiment, a tunneling layer is formed to couple the output magnet 112 with the channel 113. In one embodiment, tunneling layer is formed to couple the ground contact 114 with the channel 113.

In one embodiment, the input magnet 111 is coupled to an interconnect (not shown) to provide an input magnetic signal to the input magnet 111. In one embodiment, the output magnet 112 is coupled to an interconnect (not shown) to provide an output magnetic signal from the output magnet 112.

In one embodiment, the variable resistive magnetic device 101 is operable to enable the magnetic logic gating device 102 to drive an input magnetic signal on the input magnet 111 to the output magnet 112 when the variable resistive magnetic device 102 has a smaller resistivity compared to its reference resistivity.

In one embodiment, the variable resistive magnetic device 101 is operable to enable the magnetic logic gating device 102 to drive the input magnetic signal on the input magnet 111 to the output magnet 112 when spin polarized electrons tunnel from one end 103 to another end 104 of the variable resistive magnetic device 101, the other end 104 coupled to the magnetic logic gating device 102.

In one embodiment, the variable resistive magnetic device 101 is operable to disable the magnetic logic gating device 102 from driving the input magnetic signal on input magnet 111 to the output magnet 112 when the variable resistive magnetic device 101 has a resistivity higher than its reference resistivity.

In one embodiment, the variable resistive magnetic device 101 is operable to disable the magnetic logic gating device 102 from driving the input magnetic signal received on input magnet 111 to the output magnet 112 when the variable resistive magnetic device 101 substantially ceases transport of electron spin from the first terminal 103 (provided by the power supply 105) to the second terminal 104 of the variable resistive magnetic device 101. In one embodiment, the transport of electron spin is one of: spin diffusion; or spin tunneling.

In one embodiment, the output magnet 112 of the disabled magnetic logic gating device 102 is operable to retain previous magnetic value/state on the output magnet 112. While the embodiments herein describe the disabled magnetic logic gating device 102 with reference to three layers—layer 1 having input magnet 111 and output magnet 112, layer 2 being the channel 113, and layer 3 being the ground contact layer, fewer or more layers may be used for forming the magnetic logic gating device 102.

Figure 2A:
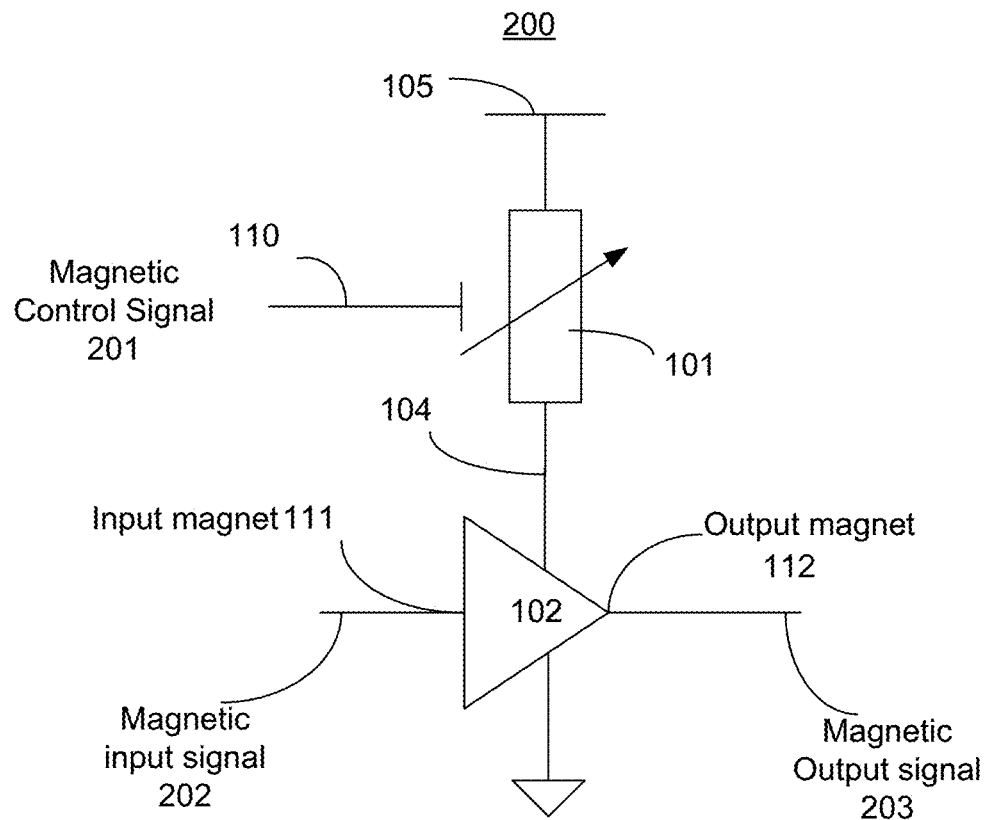
FIG. 2A is a circuit model of the spin state element with a magnetic control signal, according to one embodiment of the disclosure.

FIG. 2A is a circuit model 200 of the spin state element 100 with a magnetic control signal 201, according to one embodiment of the disclosure. FIG. 2A is described with reference to FIG. 1. So as not to obscure the embodiments of the disclosure, the same reference signs are not described again.

In one embodiment, the circuit model 200 comprises a variable resistive magnetic device 101 (the sloping arrow indicating the variable resistance of the device 101) coupled to the magnetic logic gating device 102. In one embodiment, a magnetic control signal 201 is applied to the node 110 which is coupled to the FM layer 108. In one embodiment, magnetic control signal 201 controls the resistivity of the variable resistive magnetic device 101 relative to a reference resistivity (based on the PM layer 106).

In one embodiment, the input magnetic signal 202 is applied to the input magnet 111, wherein the input magnetic signal 202 tunnels through the channel 113 to the output magnet 112 when the variable resistive magnetic device 101 has low resistance i.e., node 104 (second terminal of the variable resistive magnetic device 101) provides a power supply to the input magnet 111 and output magnet 112. In such an embodiment, the output magnet 112 provides the magnetic output signal 203 corresponding to the input magnetic signal 202. When the magnetic control signal 201 is of such a value that causes the variable resistive magnetic device 101 to exhibit high resistance, then power supply is cut off to the input magnet 111 and the output magnet 112. In such an embodiment, the magnetic input signal 202 does not tunnel through the channel 113. In this embodiment, the output magnet 112 retains its previous magnetic state.

Figure 2B:
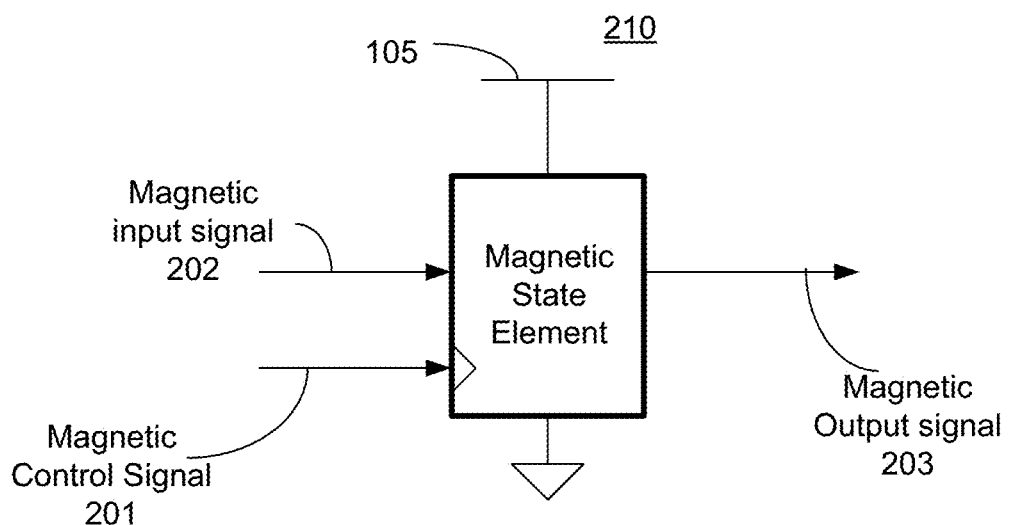
FIG. 2B is a symbol view of the circuit model of the spin state element with a magnetic control signal, according to one embodiment of the disclosure.

FIG. 2B is a symbol view 210 of the circuit model 200 of the spin state element device 100, according to one embodiment of the disclosure. FIG. 2B is discussed with reference to FIG. 1 and FIG. 2A.

Table 1 illustrates the truth table of the circuit model 200 according to one embodiment of the disclosure.

TABLE 1

Logic table for circuit model 200 of the magnetic state element 100/200/210

| Input magnetic signal 202 $IN_i$ | Magnetic Control Signal 201 | Output magnetic signal 203 $OUT_i$ |
|---|---|---|
| 1 or 0 ($IN_i$) | 0 | $OUT_{i-1}$ |
| 1 or 0 ($IN_i$) | 1 | $OUT_i$ |

In this embodiment, when the magnetic control signal has a magnetic state indicative of logical 0, the variable resistance magnetic device 101 exhibits high resistivity (compared to its reference resistivity) because the spin directions of the electrons in the PM layer 106 and the FM layer 108 are misaligned i.e., have opposite spin directions. In such an embodiment, the output magnet 112 retains its previous value/state $OUT_{i-1}$ (corresponding to the previous input magnetic signal $IN_i$).

In this embodiment, when the magnetic control signal has a magnetic state indicative of logical 1, the variable resistance magnetic device 101 exhibits low resistivity (compared to its reference resistivity) because the spin directions of the electrons in the PM layer 106 and the FM layer 108 are aligned i.e., have same spin directions. In such an embodiment, the output magnet 112 receives the input magnetic signal $IN_i$.

Figure 3A:
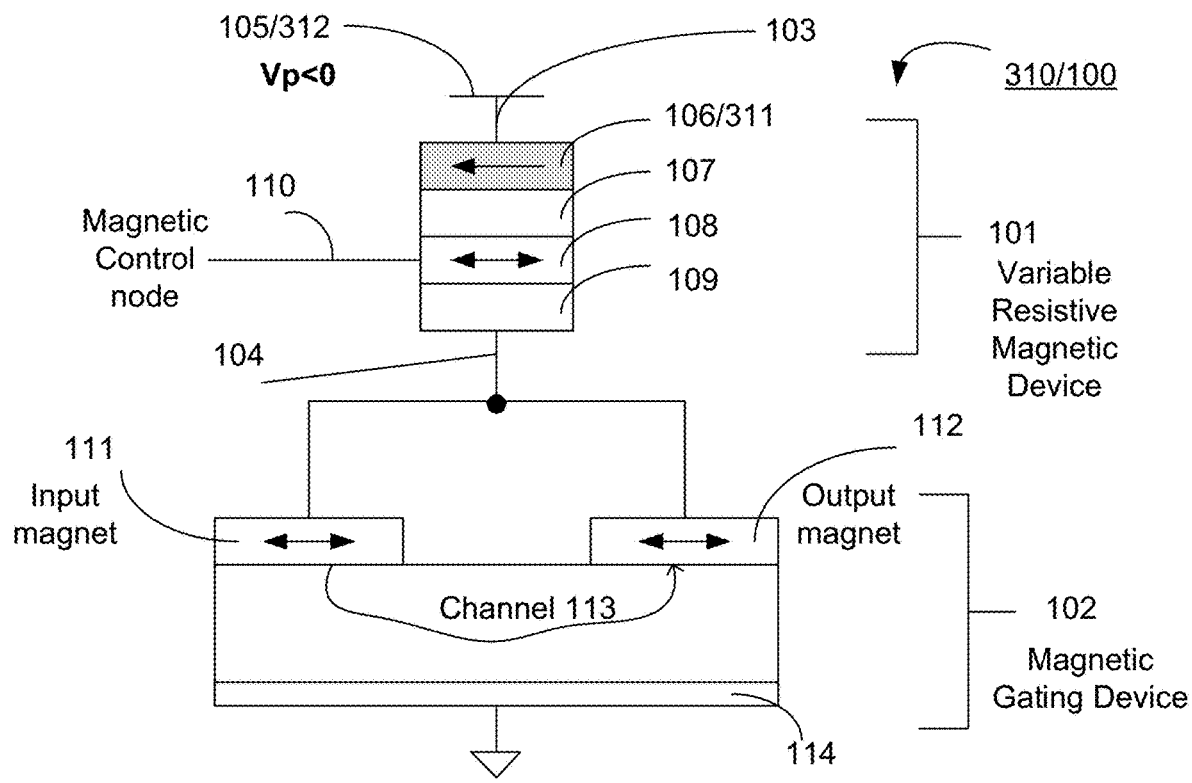
FIG. 3A is a spin state element with a magnetic control signal and operating with a negative power supply, according to one embodiment of the disclosure.

FIG. 3A is a spin state element 310/100 with a magnetic control signal 110 and operating with a negative power supply, according to one embodiment of the disclosure. So as not to obscure the embodiments of the disclosure, the reference signs discussed previously are not repeated. In this embodiment, the PM layer 106 has magnetization in the left direction (indicated as 106/311). In this embodiment, a negative power supply (e.g., −10 mV) 105/312 is applied to the first terminal 103. The embodiment of FIG. 3A is similar to the embodiment of FIG. 1 and FIG. 2A and exhibit truth table as shown in Table 1.

Figure 3B:
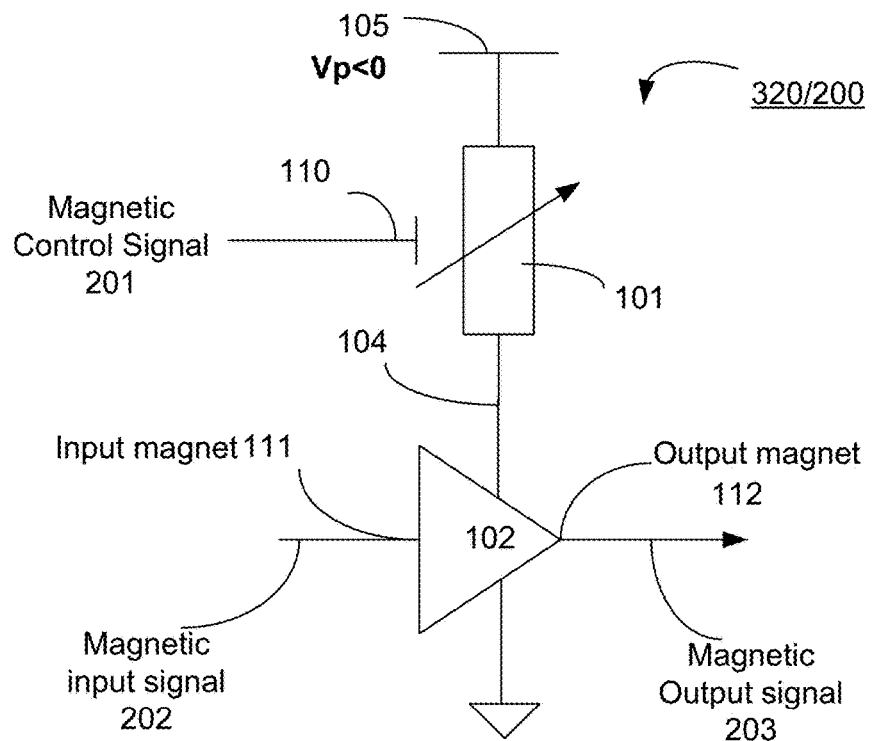
FIG. 3B is a circuit model of the spin state element with a magnetic control signal and operating with a negative power supply, according to one embodiment of the disclosure.

FIG. 3B is a circuit model 320/200 of the spin state element 310/100 with a magnetic control signal and operating with the negative power supply (Vp<0, for example, −10 mV), according to one embodiment of the disclosure. FIG. 3B is discussed with reference to FIG. 3A and Table 1.

In this embodiment, when the magnetic control signal 201 has a magnetic state indicative of logical 0, the variable resistance magnetic device 101 exhibits high resistivity (compared to its reference resistivity) because the spin directions of the electrons in the PM layer 106 and the FM layer 108 are misaligned i.e., have opposite spin directions. In such an embodiment, the output magnet 112 retains its previous value i.e., the magnetic output signal retains the previous magnetic state corresponding to the previous input magnetic signal 202.

In this embodiment, when the magnetic control signal 201 has a magnetic state indicative of logical 1, the variable resistance magnetic device 101 exhibits low resistivity (compared to its reference resistivity) because the spin directions of the electrons in the PM layer 106 and the FM layer 108 are aligned i.e., have same spin directions. In such an embodiment, the output magnet 112 receives the present input magnetic signal 202.

Figure 4A:
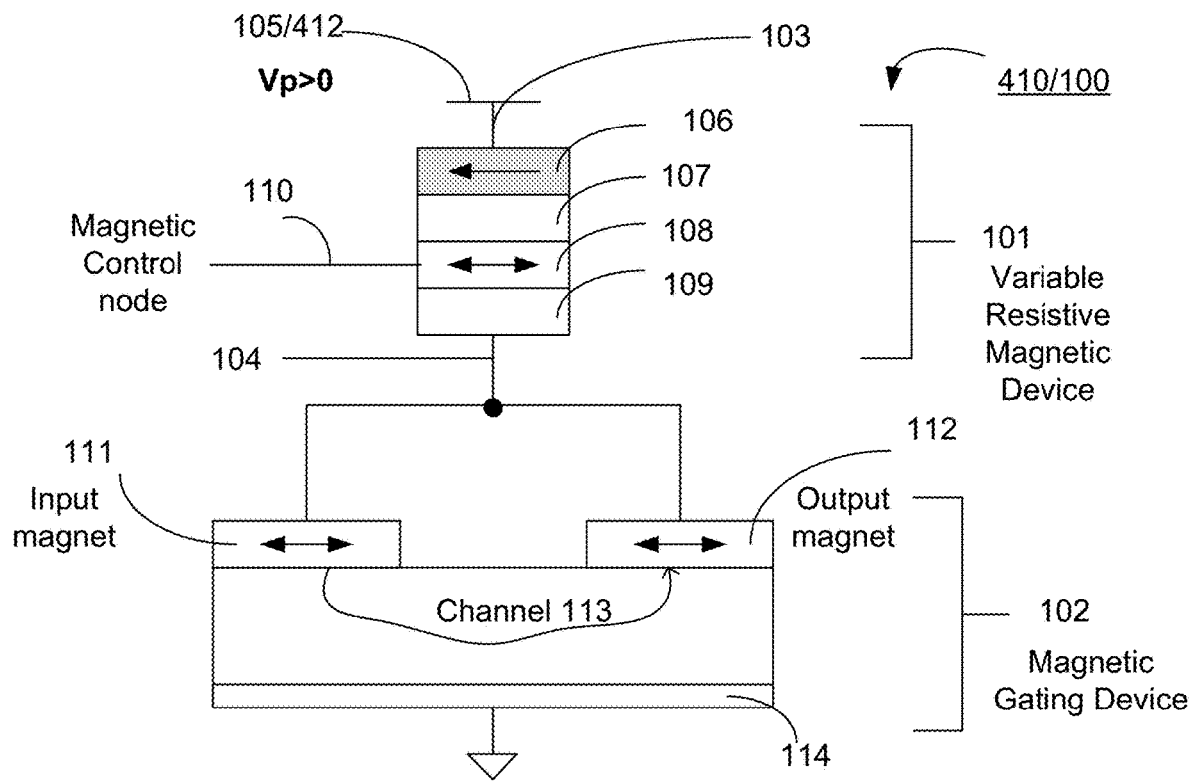
FIG. 4A is a spin state element with a magnetic control signal and operating with a positive power supply, according to one embodiment of the disclosure.

FIG. 4A is spin state element 410/100 with a magnetic control signal and operating with a positive power supply, according to one embodiment of the disclosure. So as not to obscure the embodiments of the disclosure, the reference signs discussed previously are not repeated. In this embodiment, the PM layer 106 has magnetization to the left (indicated as 106). In this embodiment, a positive power supply (e.g., +10 mV) 105/412 is applied to the first terminal 103.

Figure 4B:
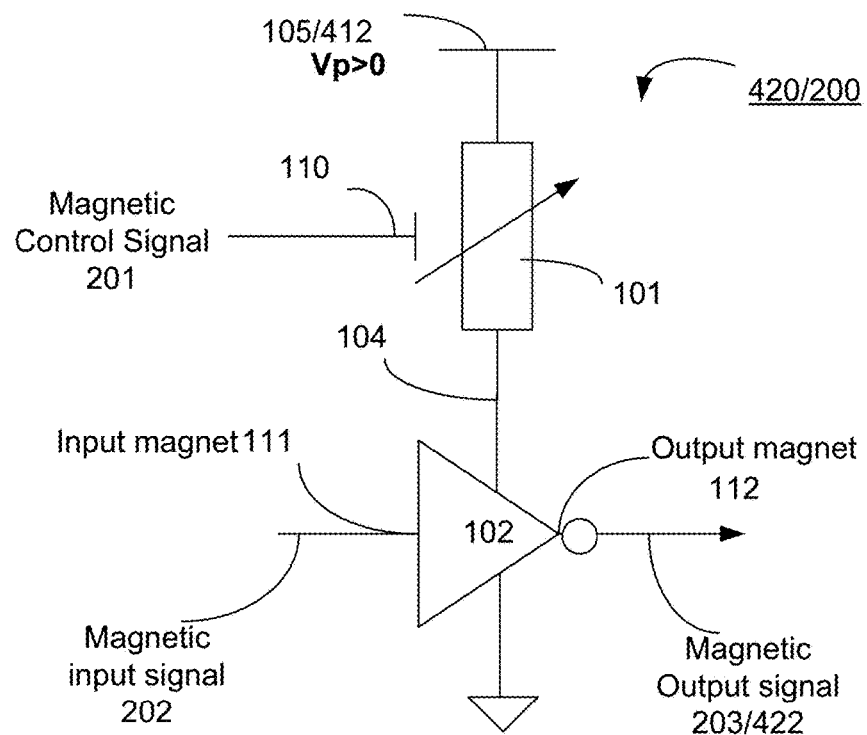
FIG. 4B is a circuit model of the spin state element with a magnetic control signal and operating with a positive power supply, according to one embodiment of the disclosure.

FIG. 4B is a circuit model 420/200 of the spin state element 410/100 with a magnetic control signal and operating with a positive power supply, according to one embodiment of the disclosure. FIG. 4B is described with reference to FIG. 4A and Table 1.

The embodiment of FIG. 4A is similar to the embodiment of FIG. 1 and FIG. 3A, however, it exhibits truth table as shown in Table 2.

TABLE 2

Logic table for the circuit model 420/200 of the magnetic state element 410/100

| Input magnetic signal (202) $IN_i$ | Magnetic Control Signal (201) | Output magnetic signal (203/422) $OUT_i$ bar |
|---|---|---|
| 1 or 0 ($IN_i$) | 0 | $OUT_{i-1}$ bar |
| 1 or 0 ($IN_i$) | 1 | $OUT_i$ bar |

Table 2 is similar to Table 1 except that the output magnetic signal 203/422 has a reverse spin compared to the spin of the output magnetic signal 203/322 in Table 1. The reverse spin of the output magnetic signal 203/422 is caused by the positive supply Vp 105/412, according to one embodiment of the disclosure. The reverse spin on the OUT signal is indicated with the "bar" label and a bubble at the output magnet 112. The label "bar" herein indicates an inversion, for example, inverted magnetic output signal.

Figure 5A:
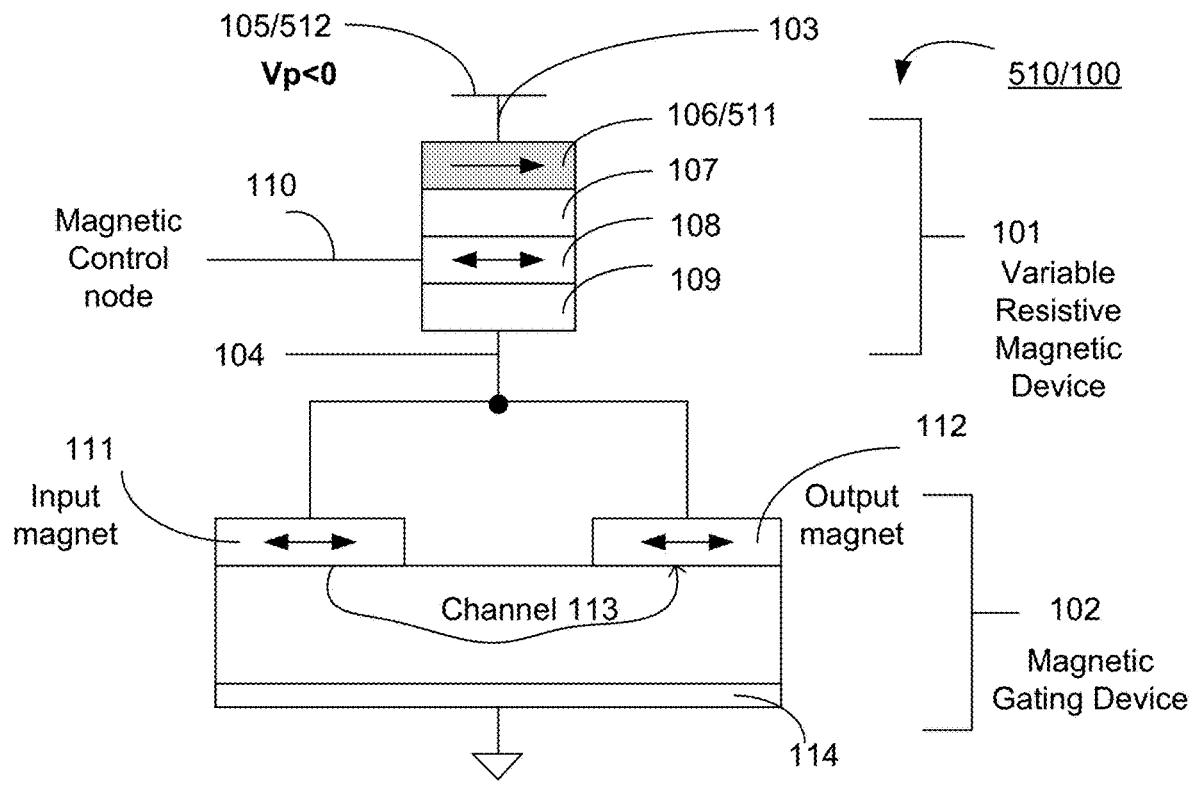
FIG. 5A is a spin state element with a magnetic control signal, the spin state element operating with a negative power supply, and with a pinned magnet having a magnetic direction different from the magnetic direction of the pinned magnets of the spin state elements of FIGS. 3A-B and FIGS. 4A-B, according to one embodiment of the disclosure.

FIG. 5A is a spin state element 510/100 with a magnetic control signal, the spin state element operating with a negative power supply, and with a pinned magnet 106/511 having a magnetic direction different from the magnetic direction of the pinned magnets 106 of the spin state elements of FIGS. 3A-B and FIGS. 4A-B, according to one embodiment of the disclosure.

Figure 5B:
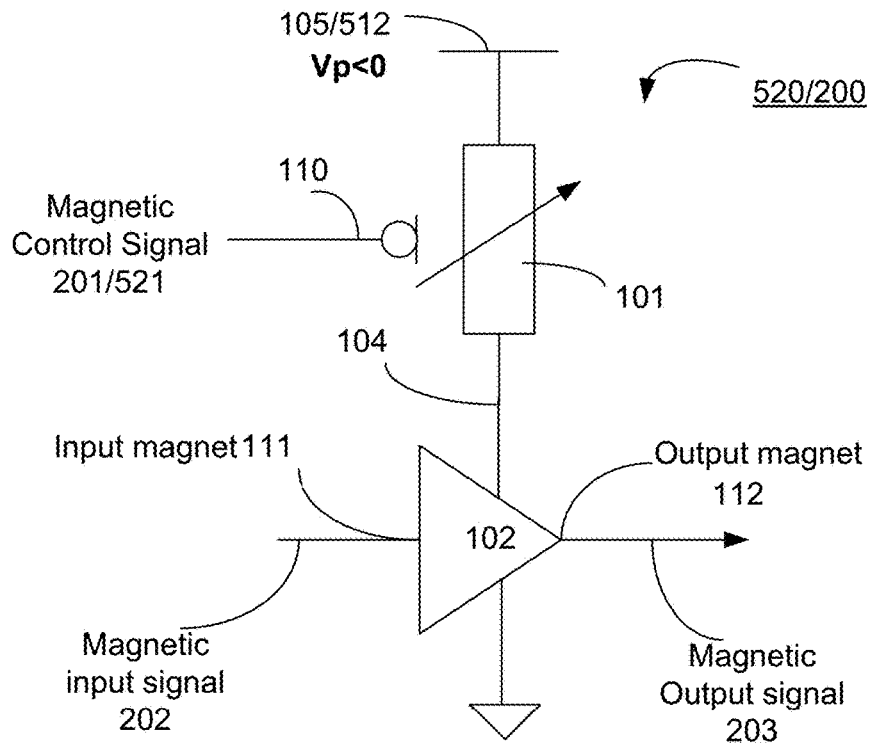
FIG. 5B is a circuit model of the spin state element with a magnetic control signal, the spin state element operating with a negative power supply, and with a pinned magnet having a magnetic direction different from the magnetic direction of the pinned magnets of the spin state elements of FIGS. 3A-B and FIGS. 4A-B, according to one embodiment of the disclosure.

FIG. 5B is a circuit model 520/200 of the spin state element 510/100 with a magnetic control signal, the spin state element operating with a negative power supply, and with a pinned magnet having a magnetic direction different from the magnetic direction of the pinned magnets of the spin state elements of FIGS. 3A-B and FIGS. 4A-B, according to one embodiment of the disclosure. So as not to obscure the embodiments of the disclosure, the reference signs discussed previously are not repeated. In this embodiment, the PM layer 106/511 has magnetization to the right. In this embodiment, a negative power supply (e.g., −10 mV) 105/512 is applied to the first terminal 103.

The embodiment of FIG. 5A exhibits truth table as shown in Table 3.

TABLE 3

Logic table for the circuit model 520/200
of the magnetic state element 510/100

| Input magnetic signal (202) $IN_i$ | Magnetic Control Signal (201/521) | Output magnetic signal (203) $OUT_i$ |
|---|---|---|
| 1 or 0 ($IN_i$) | 1 | $OUT_{i-1}$ |
| 1 or 0 ($IN_i$) | 0 | $OUT_i$ |

Table 3 is similar to Table 1 except that the magnetic control signal 201/521 has a reverse spin compared to the spin of the magnetic control signal 201 in Table 1 to generate the same output signals. The reverse spin of the magnetic control signal 201/521, compared to the magnetic control signal 201 of FIG. 3A, causes the variable resistive magnetic device 510/100 to show reverse behavior. The reverse behavior is indicated by the bubble sign at the node 110.

For example, when the magnetization direction of the PM layer 106/511 is to the right, then when the magnetic control signal 201/521 (on node 110) has magnetic state indicative of logical 1, the variable resistive magnetic device 101 substantially ceases the tunneling of spin polarized electrons from the first terminal 103 to the second end 104. In such an embodiment, the resistivity of the variable resistive magnetic device 101 is higher than its reference resistivity. In such an embodiment, when the magnetic control signal 201/521 (on node 110) has magnetic state indicative of logical 0, the variable resistive magnetic device 101 allows spin polarized electrons to tunnel from the first terminal 103 to the second end 104. In such an embodiment, the resistivity of the variable resistive magnetic device 101 is lower than its reference resistivity.

Figure 6A:
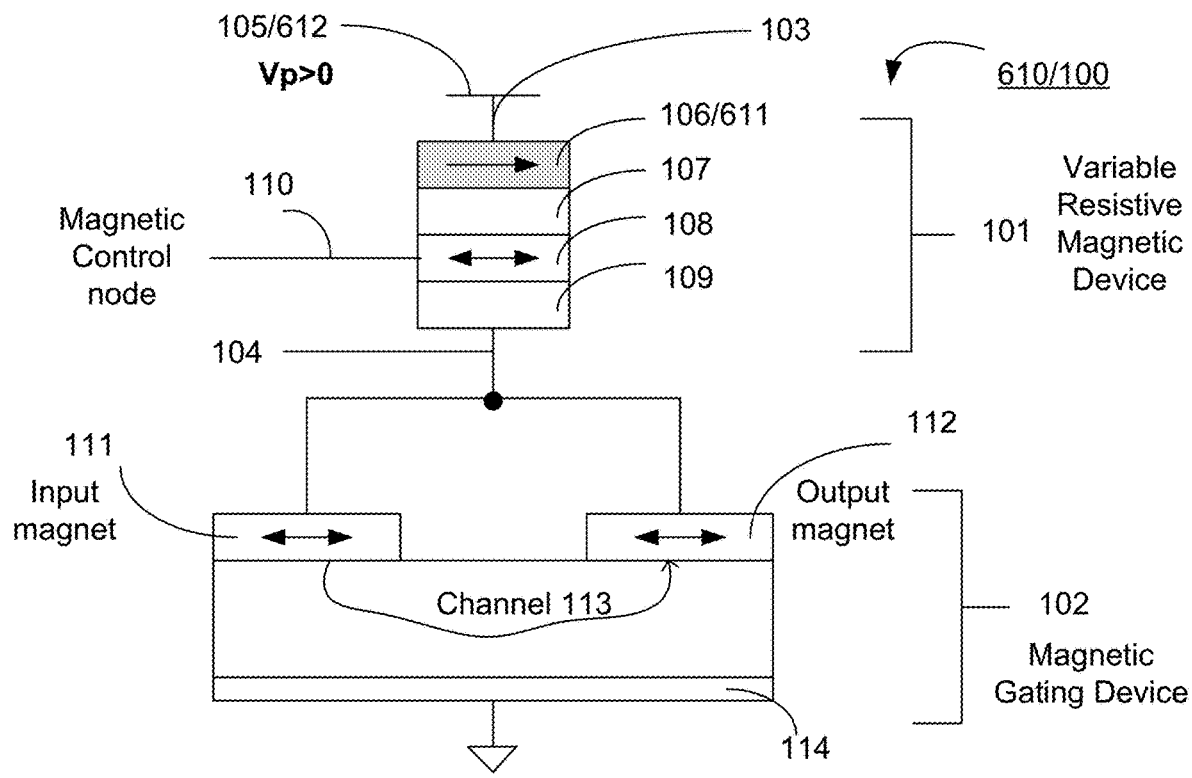
FIG. 6A is spin state element with a magnetic control signal, the spin state element operating with a positive power supply, and with a pinned magnet having a magnetic direction different from the magnetic direction of the pinned magnets of the spin state elements of FIGS. 3A-B and FIGS. 4A-B, according to one embodiment of the disclosure.

FIG. 6A is a spin state element 610/100 with a magnetic control signal, the spin state element operating with a positive power supply 106/612 (Vp>0, for example, +10 mV), and with a PM layer 106/611 having a magnetic direction different from the magnetic direction of the pinned magnets of the spin state elements of FIGS. 3A-B and FIGS. 4A-B, according to one embodiment of the disclosure. So as not to obscure the embodiments of the disclosure, the reference signs discussed previously are not repeated. In this embodiment, the PM layer 106/611 has magnetization to the right. In this embodiment, the direction of magnetization in the PM layer 106/611 inverses the behavior of the magnetic control signal on node 110 compared to the magnetic control signal 201 in FIG. 3B. In this embodiment, a positive power supply (e.g., +10 mV) 105/612 applied to the first terminal 103 causes the magnetic logic gating device 102 to have an inverse logical behavior compared to the magnetic logic gating device 102 of FIG. 3B.

Figure 6B:
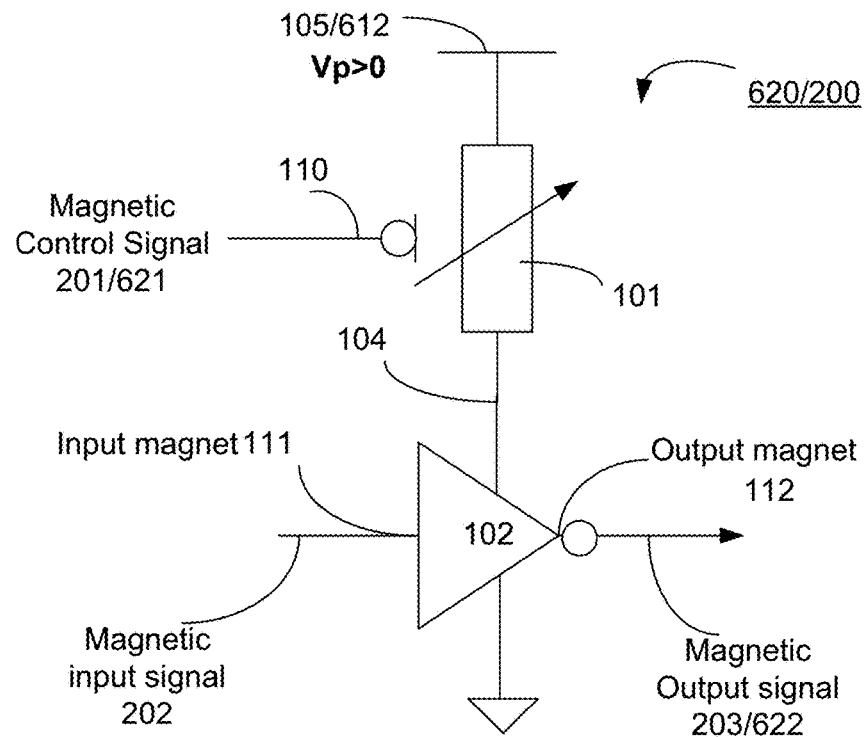
FIG. 6B is a circuit model of the spin state element with a magnetic control signal, the spin state element operating with a positive power supply, and with a pinned magnet having a magnetic direction different from the magnetic direction of the pinned magnets of the spin state elements of FIGS. 3A-B and FIGS. 4A-B, according to one embodiment of the disclosure.

FIG. 6B is a circuit model 620/200 of the spin state element 610/100 with a magnetic control signal 201, the spin state element 610/100 operating with a positive power supply, and with a pinned magnet having a magnetic direction different from the magnetic direction of the pinned magnets of the spin state elements of FIGS. 3A-B and FIGS. 4A-B, according to one embodiment of the disclosure.

The embodiments of FIG. 6A-B exhibit truth table as shown in Table 4.

TABLE 4

Logic table for the circuit model 620/200
of the magnetic state element 610/100

| Input magnetic signal (202) $IN_i$ | Magnetic Control Signal (201/621) | Output magnetic signal (203/622) $OUT_i$ |
|---|---|---|
| 1 or 0 ($IN_i$) | 1 | $OUT_{i-1}$ (bar) |
| 1 or 0 ($IN_i$) | 0 | $OUT_i$ (bar) |

Table 4 is similar to Table 1 except that the magnetic control signal 201/621 has a reverse spin compared to the spin of the magnetic control signal 201 in Table 1 to generate the same output signals. The reverse spin of the magnetic control signal 201/621, compared to the magnetic control signal 201 of FIG. 3A, causes the variable resistive magnetic device 620/200 to show reverse behavior. The reverse behavior is indicated by the bubble sign at the node 110.

For example, when the magnetization direction of the PM layer 106/611 is to the right direction, then when the magnetic control signal 201/621 (on node 110) has magnetic state indicative of logical 1, the variable resistive magnetic device 101 substantially ceases the tunneling of spin polarized electrons from the first terminal 103 to the second end 104. In such an embodiment, the resistivity of the variable resistive magnetic device 101 is higher than the reference resistivity.

In such an embodiment, when the magnetic control signal 201/621 (on node 110) has magnetic state indicative of logical 0, the variable resistive magnetic device 101 allows spin polarized electrons to tunnel from the first terminal 103 to the second end 104. In such an embodiment, the resistivity of the variable resistive magnetic device 101 is lower than the reference resistivity.

Table 4 is also similar to Table 1 except that the output magnetic signal 203/622 has a reverse spin compared to the spin of the output magnetic signal 203/322 in Table 1. The reverse spin of the output magnetic signal 203/622 is caused by the positive supply Vp (e.g., +10 mV), according to one embodiment of the disclosure. The reverse spin on the OUT signal (magnetic output signal 203/622) is indicated with the "bar" label and a bubble at the output magnet 112. The label "bar" herein indicates an inversion, for example, inverted magnetic output signal.

Figure 7:
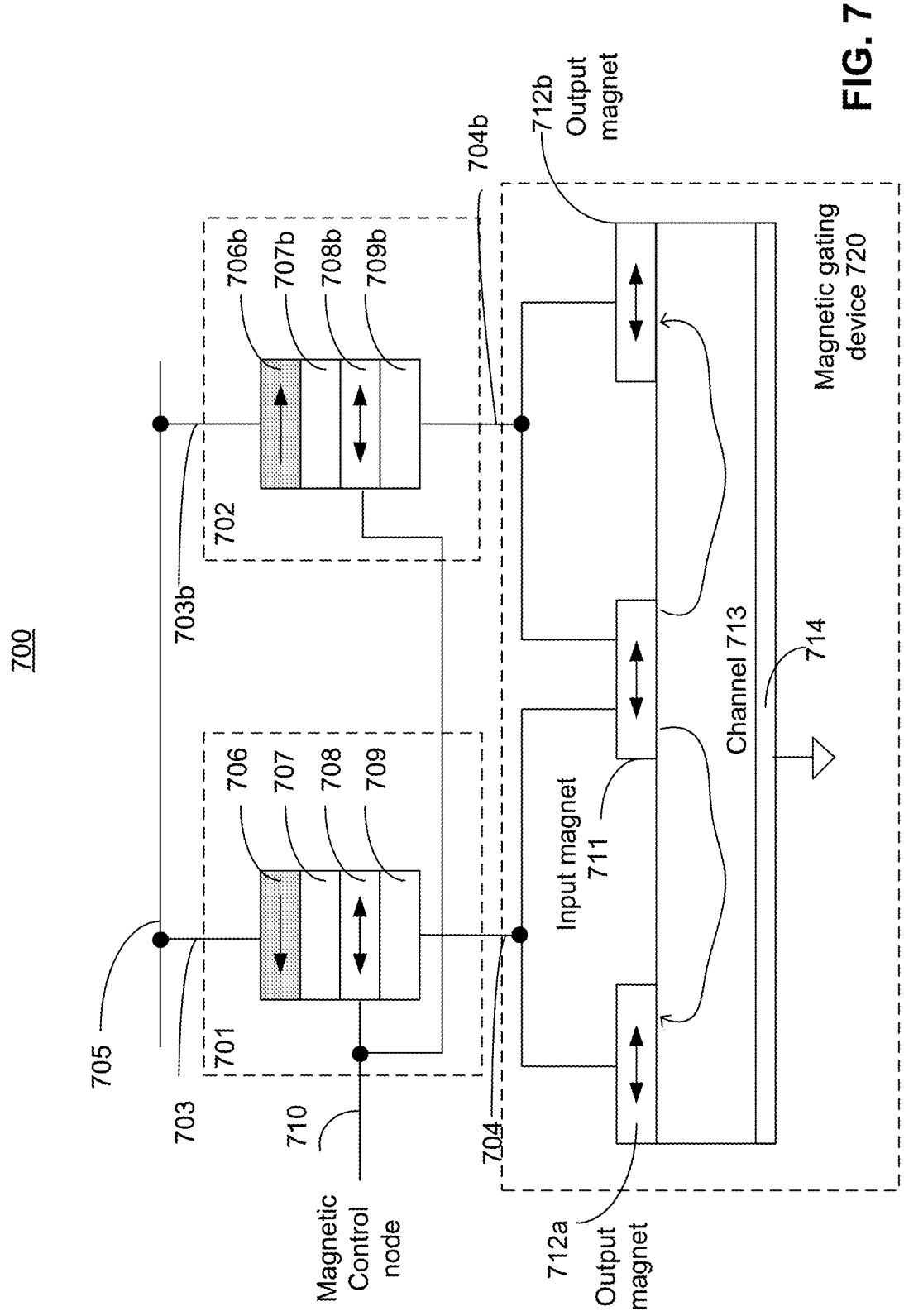
FIG. 7 is a cross-section of a spin de-multiplexer, according to one embodiment of the disclosure.

FIG. 7 is a cross-section of spin de-multiplexer 700, according to one embodiment of the disclosure. FIG. 7 is described with reference to FIGS. 1-6. So as not to obscure the embodiments of the disclosure, a 1-to-2 de-multiplexer is shown. The same concept and structure described herein may be applied to any form of de-multiplexers. For example, a 2-to-4, 1-to-4, de-multiplexers etc.

In one embodiment, the spin de-multiplexer 700 comprises a first variable resistive magnetic device 701, a second variable resistive magnetic device 702, and a magnetic logic gating device 720 coupled to the first variable resistive magnetic device 701 and the second variable resistive magnetic device 702. For 2-to-4 de-multiplexers, four variable resistive magnetic devices may be formed according to one embodiment.

So as not to obscure the embodiments of the disclosure and to avoid repetitiveness, differences between FIG. 7 and other figures are discussed. However, this should by no means limit the embodiment of FIG. 7. The plurality of layers of the first variable resistive magnetic device 701 and the second variable resistive magnetic device 702 correspond to the plurality of layers discussed with reference to FIG. 1.

For example, layers 706 and 706b correspond to PM layer 106 of FIG. 1, layers 707 and 707b correspond to layer 107 of FIG. 1, layers 708 and 708b correspond to FM layer 108 of FIG. 1, and layer 709 and 709b correspond to SSL layer 109 of FIG. 1. In this embodiment, the pinned magnet (PM) layer 706 of the first variable resistive magnetic device 701 has a magnetization direction different from the magnetization direction of the PM layer 706b of the second variable resistive magnetic device 702.

For example, the PM layer 706 has a magnetization direction to the left while PM layer 706b has a magnetization direction to the right. In other embodiments, the PM layer 706 may have a magnetization direction to the right while the PM layer 706b may have a magnetization direction to the right.

The first terminal 703 of the first variable resistive magnetic device 701 and the first terminal 703b of the second variable resistive magnetic device 702 correspond to the first terminal 103 of FIG. 1. The second terminal 704 of the first variable resistive magnetic device 701 and the second terminal 704b of the second variable resistive magnetic device 702 correspond to the second terminal 104 of FIG. 1. In one embodiment, the first terminals 703 and 703b are coupled to the power supply node 705. In other embodiments, the first terminal 703 and the second terminal 703b are coupled to independent power supply nodes (not shown) that can provide power supply to each of the first terminals 703 and 703b independent of each other. For example, a positive power supply may be provided to the first terminal 703 while a clocked power supply may be provided to the second terminal 703b. Other variations are contemplated herein.

While the embodiments herein describe a plurality of layers of the first and second variable resistive magnetic devices 701 and 702 to be four, other embodiments may use fewer than four or more than four layers of various materials to form the variable resistive magnetic device.

In one embodiment, the power supply node 705 provides a power supply which is one of: a positive power supply, a negative power supply, a DC power supply, a clocked power supply, or an unpowered power supply.

In one embodiment the magnetic logic gating device 720 comprises a plurality of output magnets and one or more input magnets. So as not to obscure the embodiments of the disclosure, a 1-to-2 de-multiplexer is shown. The same concept and structure may be applied to any form of de-multiplexers. In the embodiment discussed herein the magnetic logic gating device 720 comprises two output magnets—first output magnet 712a and the second output magnet 712b—and one input magnet 711. For 2-to-4 de-multiplexers the magnetic logic gating device 720 may comprise four output magnets and two input magnets. In one embodiment, 2-to-4 de-multiplexer may be formed by combining two 1-to-2 de-multiplexers.

In one embodiment, the output magnets 712a and 712b and the input magnet 711 are formed from the same material as the magnet 708 and 708b. In other embodiments, the output magnets 712a and 712b are formed from different material than the input magnet 711. In one embodiment, the output magnets 712a and 712b and the input magnet 711 are free magnets.

In one embodiment, the second terminal 704 of the first variable resistive magnet 701 is coupled to the first output magnet 712a and the input magnet 711. In one embodiment, the second terminal 704b of the second variable resistive magnet 702 is coupled to the second output magnet 712b and the input magnet 711. In one embodiment, a common channel 713 is shared by the output magnets 712a and 712b and the input magnet 711. The channel 712 corresponds to the channel 113 of FIG. 1. In one embodiment, the channel 713 is coupled to a ground contact layer 713 which is coupled to ground.

So as not to obscure the embodiments of the magnetic logic gating device 722, other layers are not shown. For example, the input magnet 711 and first and second output magnets 712a and 712b may have a corresponding contact layers coupled to them for contacting with the second terminals 704 and 704b respectively. In one embodiment, vertical isolation trench is formed between the contact layer 714 and the input magnet 711. In one embodiment, vertical isolation trench is formed between the contact layer 714 and the first output magnet 712a. In one embodiment, vertical isolation trench is formed between the contact layer 714 and the second output magnet 712b. In one embodiment, a tunneling layer is formed to couple the input magnet 711 with the channel 713. In one embodiment, a tunneling layer is formed to couple the first output magnet 712a with the channel 713. In one embodiment, a tunneling layer is formed to couple the second output magnet 712b with the channel 713. In one embodiment, tunneling layer is formed to couple the ground contact 714 with the channel 713.

Figure 8A:
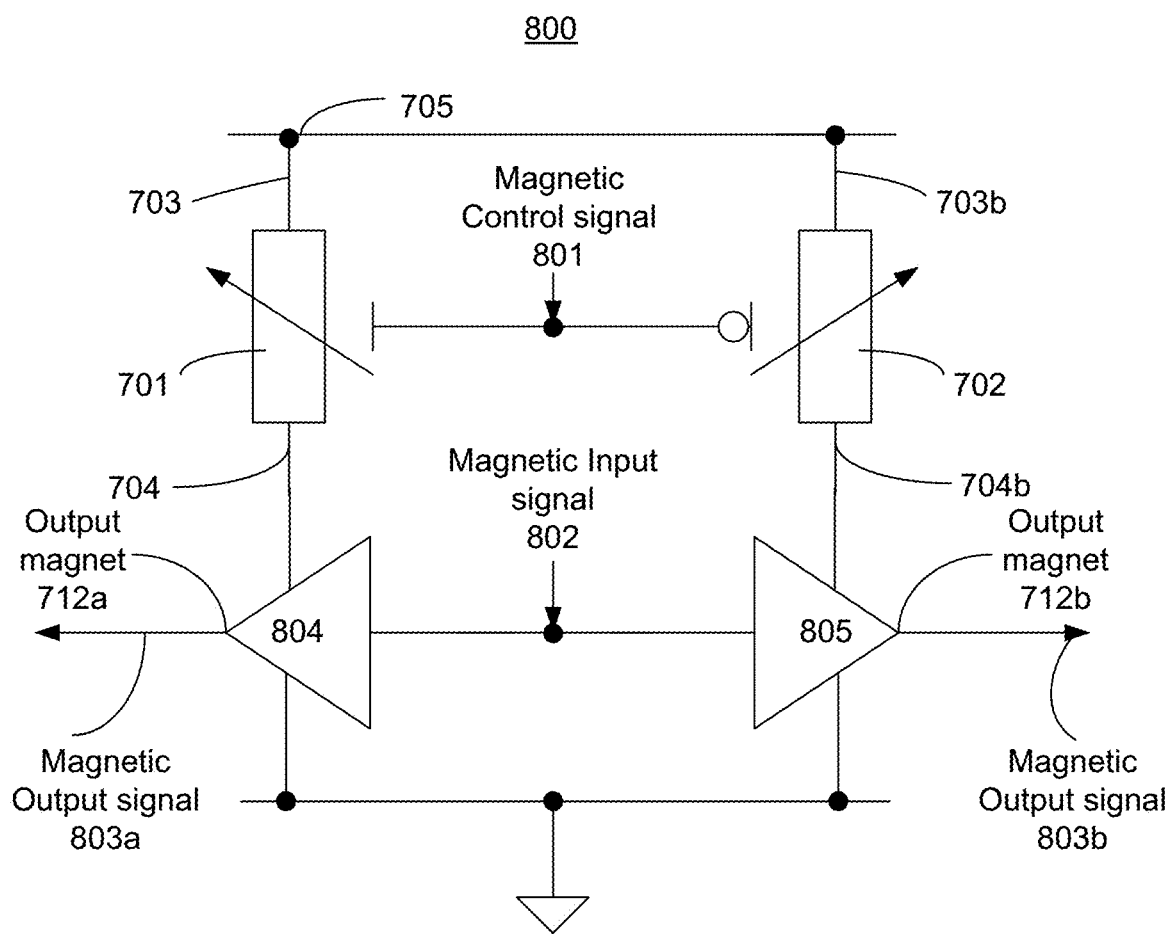
FIG. 8A is a circuit model of the spin de-multiplexer with a magnetic control signal, according to one embodiment of the disclosure.

FIG. 8A is a circuit model 800 of the spin de-multiplexer 700 with a magnetic control signal 801, according to one embodiment of the disclosure. FIG. 8A is discussed with reference to FIG. 7. In this embodiment, the magnetic control signal 801 determines the resistivity setting for the first variable resistive magnetic device 701 and the second variable resistive magnetic device 702. The magnetic control signal 801 couples to the FM layers 708 and 708b of the first and second variable resistive magnetic devices 701 and 702 respectively.

As discussed herein, the PM layers 706 and 706b have opposite magnetization directions respectively. Accordingly, the magnetic control signal 801 causes opposite resistivity changes to the first variable resistive magnetic device 701 and the second variable resistive magnetic device 702.

For example, when the magnetic control signal 801 (on node 710) has magnetic state indicative of logical 0, the first variable resistive magnetic device 701 substantially ceases the tunneling of spin polarized electrons from the first terminal 703 to the second terminal 704. In such an embodiment, the resistivity of the first variable resistive magnetic device 701 is higher than the reference resistivity of the first variable resistive magnetic device 701. As discussed herein, the reference resistivity may be determined from the PM layer 706. In such an embodiment, when the magnetic control signal 801 (on node 710) has magnetic state indicative of logical 1, the first variable resistive magnetic device 701 allows spin polarized electrons to tunnel from the first terminal 703 to the second terminal 704. In such an embodiment, the resistivity of the second variable resistive magnetic device 701 is lower than the reference resistivity of the first variable resistive magnetic device 701.

The second terminal 704 provides power supply to the magnetic logic gating device 804 (comprising 712a, 711, 713, 714). The second terminal 704b provides power supply to the magnetic logic gating device 805 (comprising 712b, 711, 713, 714).

In one embodiment, when the magnetic control signal 801 (on node 710) has magnetic state indicative of logical 1, the second variable resistive magnetic device 702 substantially ceases the tunneling of spin polarized electrons from the first terminal 703*b* to the second terminal 704*b*. In such an embodiment, the resistivity of the second variable resistive magnetic device 702 is higher than the reference resistivity. As discussed herein, the reference resistivity may be determined from the PM layer 706*b*. In such an embodiment, when the magnetic control signal 801 (on node 710) has magnetic state indicative of logical 0, the second variable resistive magnetic device 702 allows spin polarized electrons to tunnel from the first terminal 703*b* to the second terminal 704*b*. In such an embodiment, the resistivity of the second variable resistive magnetic device 702 is lower than the reference resistivity of the second variable resistive magnetic device 702.

In one embodiment, the magnetic input signal 802 is applied to the input magnet 711. Depending on the resistance of the first and second variable resistive magnetic devices 701 and 702, the magnetic input signal 802 tunnels to either the first output magnet 712*a* or the second output magnet 712*b*. In an embodiment, when the first variable resistive magnetic device 701 has a high resistance compared to its reference resistivity, the magnetic output signal 803*a* on the output magnet 712*a* retains its previous magnetic state. In such an embodiment, the magnetic control signal 801 causes the second variable resistive magnetic device 702 to have a low resistance compared to its reference resistivity. In this embodiment, the magnetic output signal 803*b* on the output magnet 712*b* receives the current magnetic state of the input magnetic signal 802.

Figure 8B:
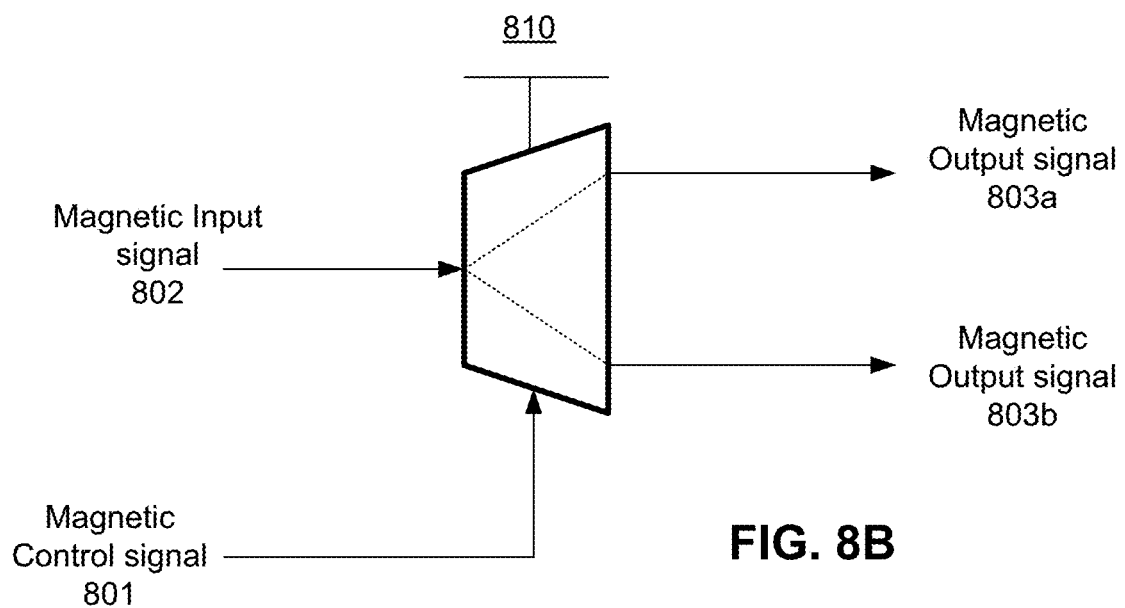
FIG. 8B is a symbol view of the circuit model of the spin state de-multiplexer with a magnetic control signal, according to one embodiment of the disclosure.

FIG. 8B is a symbol view 810 of the circuit model 800 of the spin state de-multiplexer 700 with a magnetic control signal, according to one embodiment of the disclosure. FIG. 8B is explained with reference to FIGS. 7-8A and Table 5.

TABLE 5

Logic table for the magnetic state element 700/800

| Input magnetic signal (802) $IN_i$ | Magnetic Control Signal (801) | Output magnetic signal (803a) $OUT1_i$ | Output magnetic signal (803b) $OUT2_i$ |
|---|---|---|---|
| 1 or 0 ($IN_i$) | 1 | $OUT1_{i-1}$ | $IN_i$ |
| 1 or 0 ($IN_i$) | 0 | $IN_i$ | $OUT1_{i-1}$ |

As discussed with reference to FIGS. 3-6, changing the power supply at node 705 (same as 105 in FIG. 1), can reverse the spin direction and thus the behavior of the magnetic de-multiplexer 800. By changing the polarity of the power supplies, complementary logic design can be achieved.

FIG. 9 is a general purpose spin finite state machine 900, according to one embodiment of the disclosure. In one embodiment, the spin finite state machine 900 comprises a magnetic clock unit 901, a next magnetic state logic 902, a magnetic state register 903, and the magnetic output logic 904 coupled together as shown. Interconnects 905, 906, 907, 908, 909, and 910 carry magnetic signals. The logic units 901, 902, 903, and 904 may comprise the magnetic state element 100 and/or the magnetic de-multiplexer 700 as discussed herein. The 905, 906, 907, 908, 909, and 910 may be coupled to nodes 110, 111, 112, 105 of FIG. 1 and/or 705, 710, 712*a*, 711, and 712*b* of FIG. 7.

In one embodiment, magnetic clock unit 901 generates a toggling magnetic signal on node 910 for the magnetic state register 902. For example, the toggling magnetic signal is used to provide power supply (105) to the magnetic state element 100. In one embodiment, node 910 is coupled to node 110 to control to the magnetic state register 903.

The general purpose spin finite state machine 900 provides the basic building block for implementing execution units and arithmetic logic units (ALU) in processors. The embodiments discussed herein can thus be used to make any logic gate (e.g., multiplexer, NAND gate, NOR gate, etc) using the magnetic state element 100 and/or the magnetic de-multiplexer 700 as discussed herein.

Figure 10:
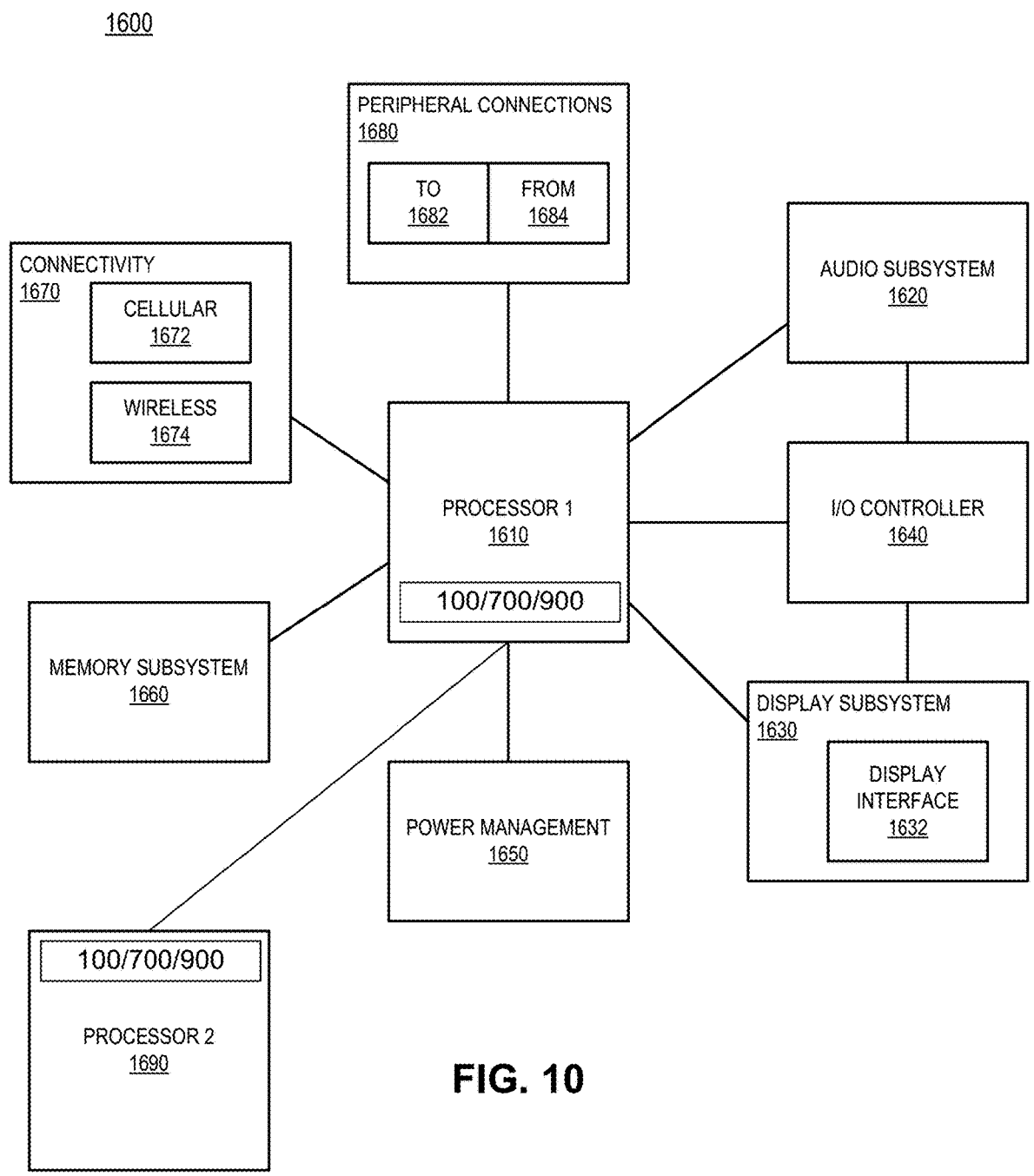
FIG. 10 is a system-level diagram of a smart device comprising a processor with the spin state element and/or the spin de-multiplexer, according to one embodiment of the disclosure.

FIG. 10 is a system-level diagram of a smart device comprising a processor with the spin state element and/or the spin de-multiplexer, according to one embodiment of the disclosure. FIG. 10 also illustrates a block diagram of an embodiment of a mobile device in which flat surface interface connectors could be used. In one embodiment, the computing device 1600 represents a mobile computing device, such as a computing tablet, a mobile phone or smart-phone, a wireless-enabled e-reader, or other wireless mobile device. It will be understood that certain of the components are shown generally, and not all components of such a device are shown in device 1600.

In one embodiment, the computing device 1600 includes a first processor 1610 with the magnetic state element 100 and/or magnetic de-multiplexer 700, and a second processor 1690 with the magnetic state element 100 and/or magnetic de-multiplexer 700, according to the embodiments discussed herein.

The various embodiments of the present disclosure may also comprise a network interface within 1670 such as a wireless interface so that a system embodiment may be incorporated into a wireless device, for example, cell phone or personal digital assistant.

In one embodiment, the processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, the computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, the I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, the computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). For example, the method of forming the state elements discussed herein can be implemented by computer executable instructions. The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

The magnetic state element 100 and magnetic de-multiplexer 700 discussed herein can be used for wireless circuits. In one embodiment, magnetic state element 100 and magnetic de-multiplexer 700 are used in blocks 1670, 1680, 1620, 1640, and 1630.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment the apparatus comprises: a variable resistive magnetic device to receive a magnetic control signal to adjust resistance of the variable resistive magnetic device; and a magnetic logic gating device, coupled to the variable resistive magnetic device, to receive a magnetic logic input and perform logic operation on the magnetic logic input and to drive an output magnetic signal based on the resistance of the variable resistive magnetic device. In one embodiment, the magnetic control signal is a magnetic state for coupling to a free magnet layer of the variable resistive magnetic device. In one embodiment, the variable resistive magnetic device is operable to receive the magnetic control signal which is one of: an electric field; or a spin current.

In one embodiment, the magnetic logic gating device comprises: an input magnet to receive the magnetic logic input; and an output magnet to drive the output magnetic signal. In one embodiment, the variable resistive magnetic device is operable to enable the magnetic logic gating device to drive the magnetic logic input to the output magnet when the variable resistive magnetic device has a smaller resistivity compared to a reference resistivity.

In one embodiment, the variable resistive magnetic device is operable to enable the magnetic logic gating device to drive the magnetic logic input to the output magnet when spin polarized electrons tunnel from one end to another end of the variable resistive magnetic device, the other end coupled to the magnetic logic gating device. In one embodiment, the variable resistive magnetic device is operable to disable the magnetic logic gating device from driving the magnetic logic input to the output magnet when the variable resistive magnetic device has a resistivity higher than a reference resistivity.

In one embodiment, the variable resistive magnetic device is operable to disable the magnetic logic gating device from driving the magnetic logic input to the output magnet when the variable resistive magnetic device substantially ceases transport of electron spin from one end to another end of the variable resistive magnetic device, the other end coupled to the magnetic logic gating device. In one embodiment, the other end is coupled to the input magnet and the output magnet of the magnetic logic gating device. In one embodiment, the output magnet of the disabled magnetic logic gating device to keep previous magnetic value on the output magnet. In one embodiment, the variable resistive magnetic device is operable to substantially cease transport of electron spin which is one of: spin diffusion; or spin tunneling. In one embodiment, the variable resistive magnetic device is based on at least one of: a magnetic tunnel junction (MTJ); or spin valve.

In one embodiment, the variable resistive magnetic device comprises: a first terminal coupled to a power supply; a second terminal coupled to the magnetic logic gating device; and a third terminal to receive the magnetic control signal. In one embodiment, the first terminal is operable to receive at least one of: a positive power supply; a negative power supply; a direct-current (DC) power supply; a clocked power supply; or an unpowered supply. In one embodiment, the second terminal is operable to provide the power supply or a version of the power supply to the magnetic logic gating device.

In one embodiment, the variable resistive magnetic device comprises: a first layer having a pinned magnet to provide reference; and a plurality of magnetic layers, one of which is coupled to the first layer, wherein at least one of the plurality of magnetic layers is susceptible to electron spin current. In one embodiment, the plurality of magnetic layers of the variable resistive device comprises a free magnet layer, and wherein the magnetic control signal is a magnetic state coupled to the free magnet layer. In one embodiment, the plurality of magnetic layers of the variable resistive device comprises a spin-scramble-layer (SSL) to make electron current, from the variable resistive magnetic device, non-spin polarized. In one embodiment, the SSL is used to convert a spin-dependent electro-chemical potential to a scalar voltage at one terminal of the variable resistive magnetic device. In one embodiment, the SSL has a short-spin flip length to de-phase electron spin in the variable resistive magnetic device. In one embodiment, wherein the variable resistive magnetic device and the magnetic logic gating device form an electron spin state element.

In another example, a magnetic de-multiplexer comprises: a first variable resistive magnetic device to receive a magnetic control signal to adjust resistance of the first variable resistive magnetic device; a second variable resistive magnetic device to receive the magnetic control signal to adjust resistance of the second variable resistive magnetic device; and a magnetic logic gating device, coupled to the first and second variable resistive magnetic devices, the magnetic logic gating device having at least two output magnets to output magnetic signals based on the resistances of the first and second variable resistive magnetic devices.

In one embodiment, the magnetic control signal is a magnetic state for coupling to free magnet layers of the first and second variable resistive magnetic devices. In one embodiment, the first variable resistive magnetic device comprises a pinned magnet which is complementary to a pinned magnet of the second variable resistive magnetic device. In one embodiment, the resistance of the first variable resistive magnetic device is different from the resistance of the second variable resistive magnetic device. In one embodiment, the magnetic logic gating device comprises an input magnet to receive an input magnetic signal. In one embodiment, the at least two output magnets include a first output magnet to drive the input magnetic signal when the resistance of the first variable resistive magnetic device is different from the resistance of the second variable resistance magnetic device. In one embodiment, the at least two output magnets include a second output magnet to retain previous magnetic value on the second output magnet. In one embodiment, the first and second variable resistive magnetic devices are based on at least one of: a magnetic tunnel junction (MTJ); or a spin valve.

In one embodiment, the first and second variable resistive magnetic devices comprise: a first terminal coupled to a power supply; a second terminal coupled to the magnetic logic gating device; and a third terminal to receive the magnetic control signal. In one embodiment, the first terminal is operable to receive at least one of: a positive power supply; a negative power supply; a direct-current (DC) power supply; a clocked power supply; or an unpowered supply. In one embodiment, the second terminal is operable to provide the power supply or a version of the power supply to the magnetic logic gating device.

In one embodiment, the first and second variable resistive magnetic devices comprise: a first layer having a pinned magnet to provide a reference; and a plurality of magnetic layers, one of which is coupled to the first layer, wherein at least one of the plurality of magnetic layers is susceptible to electron spin current. In one embodiment, the plurality of magnetic layers of the first and second variable resistive devices comprise a free magnet layer, and wherein the magnetic control signal is a magnetic state coupled to the free magnet layer. In one embodiment, the plurality of magnetic layers of the first and second variable resistive devices comprise a spin-scramble-layer (SSL) to make electron current, from the first and second variable resistive devices, non-spin polarized.

In one embodiment, the SSL is used to convert a spin-dependent electro-chemical potential to a scalar voltage at one terminal of the first and second variable resistive magnetic devices. In one embodiment, the SSL has a short-spin flip length to de-phase electron spin in the first and second variable resistive magnetic devices. In one embodiment, the reference of the first variable resistive magnetic device is different from the reference of the second variable resistive magnetic device. In one embodiment, the first and second variable resistive magnetic devices are operable to receive the magnetic control signal which is one of: an electric field; or a spin current.

In another example, a magnetic spin logic unit comprises: a magnetic state element device according the apparatus discussed herein; and a magnetic de-multiplexer, directly or indirectly coupled to the magnetic state element device, the magnetic de-multiplexer according the magnetic de-multiplexer discussed herein. In one embodiment, the magnetic state element comprises at least one of: a magnetic D-flip-flip; or a set of magnetic flip-flips. In one embodiment, the magnetic spin logic unit further comprises magnetic combinatorial logic units including a magnetic logic gating device.

In another example, a computer system comprises: a wireless antenna; and a processor capable of communicating via the wireless antenna, the processor having at least one of: a magnetic state element according to the apparatus discussed herein; or a magnetic de-multiplexer, directly or indirectly coupled to the magnetic state element, the magnetic de-multiplexer according to the de-multiplexer discussed herein.

In one embodiment, the magnetic state element comprises at least one of: a magnetic D-flip-flip; or a set of magnetic flip-flips. In one embodiment, the computer system further comprises magnetic combinatorial logic units including a magnetic logic gating device. In one embodiment, the computer system further comprises a display unit.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   an input magnet;
   an output magnet;
   a channel connected to the input and output magnets; and
   a magnetic junction having a free magnetic layer connected to the input and the output magnets, wherein the input and output magnets have free magnetizations.

2. The apparatus of claim 1, wherein the magnetic junction is a spin valve.

3. The apparatus of claim 1, wherein a magnetic control node is coupled to the free magnetic layer of the magnetic junction.

4. The apparatus of claim 3, wherein the magnetic control node is to provide a spin current.

5. The apparatus of claim 1, wherein a portion of the channel is coupled to ground.

6. The apparatus of claim 1, wherein the magnetic junction comprise a fixed magnetic layer coupled to a power supply node.

7. The apparatus of claim 6, further comprising a layer which includes Pt, wherein the layer is adjacent to the fixed magnetic layer.

8. The apparatus of claim 6, wherein the fixed magnetic layer includes Co.

9. The apparatus of claim 6, further comprising a metal layer coupled between the fixed magnetic layer and the free magnetic layer.

10. The apparatus of claim 9, wherein the metal layer includes Cu.

11. The apparatus of claim 1, further comprising:
    a first contact layer positioned between the input magnet and the free magnetic layer; and
    a second contact layer positioned between the output magnet and the free magnetic layer, wherein the first and second contact layers are coupled to each other.

12. A method comprising:
    forming an input magnet;
    forming an output magnet;
    forming a channel connected to the input and output magnets; and
    forming a magnetic junction having a free magnetic layer coupled connected to the input and the output magnets, wherein the input and output magnets have free magnetizations.

13. The method of claim 12, wherein the magnetic junction is a spin valve.

14. The method of claim 12, further comprising coupling a magnetic control node to the free magnetic layer of the magnetic junction, wherein the magnetic control node is to provide a spin current.

15. The apparatus of claim 6, further comprising a layer which includes: Mn, wherein the layer is adjacent to the fixed magnetic layer.

16. The apparatus of claim 6, wherein the fixed magnetic layer includes: Fe.

17. The apparatus of claim 6, wherein the fixed magnetic layer includes: B.

18. An apparatus comprising:
an input magnet with free magnetization;
an output magnet with free magnetization;
a channel connected to the input and output magnets; and
a magnetic junction having a free magnetic layer coupled to the input magnet and the output magnet;
a layer positioned between the input magnet and the free magnetic layer; and
a first contact layer positioned between the layer and the input magnet;
a second contact layer positioned between the output magnet and the layer, wherein the first and second contact layers are coupled to each other.

19. The apparatus of claim 18, wherein the layer includes one of ruthenium or thallium.

20. The apparatus of claim 18, wherein the layer is first layer, wherein the apparatus comprises a second layer directly coupled to the channel, wherein the second layer provides a ground supply.

21. The apparatus of claim 18, wherein the magnetic junction is operable to enable a logic gating device comprising the input magnet, the output magnet, and the channel, to drive a magnetic signal on the input magnet to the output magnet.

22. The apparatus of claim 21, wherein the output magnet is configured to retain a previous magnetic value or state on the output magnet when the logic gating device is disabled.

23. An apparatus comprising:
an input magnet;
an output magnet;
a channel connected to the input and output magnets;
a magnetic junction having a free magnetic layer; and
a layer connected to the free magnetic layer of the magnetic junction and the input and output magnets, wherein the input and output magnets have free magnetizations.

24. The apparatus of claim 23, wherein the layer includes one of ruthenium or thallium.

25. The apparatus of claim 23, wherein the layer is a spin-scramble layer that makes electron current from the free magnetic layer of the magnetic junction polarized.

26. A method comprising:
forming an input magnet;
forming an output magnet;
forming a channel connected to the input and output magnets;
forming a magnetic junction having a free magnetic layer; and
forming a layer connected to the free magnetic layer of the magnetic junction and the input and output magnets, wherein the input and output magnets have free magnetizations.

27. The method of claim 26, wherein the layer includes one of ruthenium or thallium.

28. The method of claim 26, wherein the layer is a spin-scramble layer, wherein the method comprises polarizing electron current from the free magnetic layer of the magnetic junction.

* * * * *